(12) United States Patent
Ayres, III et al.

(10) Patent No.: US 7,855,891 B1
(45) Date of Patent: Dec. 21, 2010

(54) MODULAR HEAT SINKS FOR HOUSINGS FOR ELECTRONIC EQUIPMENT

(75) Inventors: John Wise Ayres, III, Cumming, GA (US); Grant Joseph Kruse, Owens Cross Roads, AL (US); Jacob Daniel McCleary, Harvest, AL (US)

(73) Assignee: Adtran, Inc., Huntsville, AL (US)

( * ) Notice: Subject to any disclaimer, the term of this patent is extended or adjusted under 35 U.S.C. 154(b) by 154 days.

(21) Appl. No.: 12/054,735

(22) Filed: Mar. 25, 2008

(51) Int. Cl.
*H05K 7/20* (2006.01)
*F28F 7/00* (2006.01)
*H01L 23/34* (2006.01)

(52) U.S. Cl. .............. 361/711; 361/704; 361/719; 165/80.2; 165/185; 174/547; 174/252; 174/548; 257/713; 312/236

(58) Field of Classification Search ............... 361/704, 361/715–716, 711, 719, 707; 165/80.2, 185; 174/252, 547, 548; 257/713; 312/236
See application file for complete search history.

(56) References Cited

U.S. PATENT DOCUMENTS

| | | | | |
|---|---|---|---|---|
| 5,117,067 A | 5/1992 | Jaycox | .................. | 174/38 |
| 5,323,454 A | 6/1994 | Shay et al. | .................. | 379/327 |
| 5,502,618 A * | 3/1996 | Chiou | .................. | 361/695 |
| 5,734,776 A | 3/1998 | Puetz | .................. | 385/134 |
| 5,781,410 A | 7/1998 | Keown et al. | ............... | 361/690 |
| 5,886,296 A | 3/1999 | Ghorgani et al. | ............. | 174/50 |
| 6,065,530 A * | 5/2000 | Austin et al. | .............. | 165/80.3 |
| 6,535,603 B2 | 3/2003 | Laetsch | ..................... | 379/338 |
| 6,760,531 B1 | 7/2004 | Solheid et al. | ............. | 385/135 |
| 6,798,878 B2 | 9/2004 | Laetsch | ..................... | 379/338 |
| 6,977,815 B2 * | 12/2005 | Hsu | .......................... | 361/704 |
| 7,075,789 B2 | 7/2006 | Gustine et al. | ............. | 361/703 |
| 7,132,605 B2 | 11/2006 | Holmberg et al. | .......... | 174/135 |
| 7,190,874 B1 | 3/2007 | Barth et al. | ................. | 385/135 |
| 7,589,971 B2 * | 9/2009 | Gordon et al. | ............. | 361/710 |
| 2002/0141159 A1 * | 10/2002 | Bloemen | ................... | 361/704 |
| 2003/0078015 A1 | 4/2003 | Laetsch | ..................... | 455/90 |
| 2006/0193590 A1 | 8/2006 | Puetz et al. | ................. | 385/135 |
| 2007/0047894 A1 | 3/2007 | Holmberg et al. | .......... | 385/135 |

* cited by examiner

*Primary Examiner*—Zachary M Pape
(74) *Attorney, Agent, or Firm*—Allen, Dyer, Doppelt, Milbrath & Gilchrist, P.A.

(57) ABSTRACT

A housing for an outside plant telecommunication equipment (OSP) which uses modular heat sink assemblies. OSP housings contain electronic circuit boards on which are mounted electrical components that generate heat. Thermal conductors or mesas contact the electrical components to conduct heat from the components to the environment. Rather than create single purpose housings with cast thermal conductors, the improved housing uses heat sink plates which can easily be swapped out to accommodate a variety of electronic circuit boards that might be needed within a general purpose housing. Together with faster turnaround time to create a new design for a housing, lower manufacturing and inventory costs result.

3 Claims, 6 Drawing Sheets

MODULAR HEAT SINKS FOR HOUSINGS FOR ELECTRONIC EQUIPMENT

BACKGROUND OF THE INVENTION

1. Field of the Invention

The invention is related to heat sinks and more particularly to modular heat sinks for housings for electronic equipment.

2. Description of the Prior Art

Conventional housings for outside plant (OSP) telecommunication equipment, such as an ADTRAN TA1148 OSP housing, are typically designed for a specific product and generally are product limited. When a service provider, such as a telecommunications company, requires significant changes to an OSP product or a manufacturer introduces a new product, it is often necessary to provide a new OSP housing. When the new housing requires geometric (i.e., size, material thickness, etc.) and other changes, such changes usually add cost and undesirable manufacturing delay. Hence a new housing, though required, has undesirable consequences. As such, there is a need for an improved housing that is readily available to meet new specifications and that reduces cost and delays. Most OSP housings have conventional heat transfer structures for keeping temperatures of electrical components on printed circuit boards within a desirable range of values.

Conventional OSP housings typically comprise a cast housing with thermal conductors fabricated as integral parts of the housing during the casting process. Such a housing is typically a single use part that is designed to enclose a specific product. The housing is generally expensive to manufacture (because of tooling and other costs). Conventional housings have delivery times in the 10-15 week range. The typical conventional housing is a single use housing making it expensive. Changes to the housing may result in undesirable delay. Thus, there is a need for an improved housing system.

PROBLEMS OF THE PRIOR ART

In the prior art, housings for electronic equipment are often made of castings; specifically, a main casting and a cover casting. It is often necessary to remove the heat generated by electronic components mounted to a printed circuit board enclosed by the housing. In the prior art, the printed circuit board is mounted to a casting which has elevated thermal conductors or mesas which are arranged to contact the components requiring the heat dissipation to permit heat flow from the component to the casting to the external environment. As a result, when a new printed circuit board is designed to be placed in the housing, and the new printed circuit board has a different layout of electronic components, it is necessary to create a new casting which has the thermal conductors or mesas in the locations needed for the new printed circuit board layout. As a result, a completely new casting is required. The design and fabrication of a new casting is very expensive. In addition, delivery times for a new casting can be in the 10-15 week range. Further, exacting tolerances need to be realized in a casting so that the thermal conductors come into contact with the appropriate electronic components when the printed circuit board is mounted to the casting. Alternatively, it is necessary to take a relatively rougher casting and machine down the thermal conductors to the elevation necessary to ensure a good thermal match with the components on the printed circuit board.

BRIEF SUMMARY OF THE INVENTION

A Modular OSP housing system (housing system) disclosed herein addresses various problems associated the transfer methods used with conventional OSP housings. A disclosed heat transfer system comprises a heat sink plate and one or more thermal conductors formed on or connected to the surfaces of the heat sink plate. The thermal conductors extend from one surface of a heat sink plate towards the electronic components on the PC boards. Another surface of the heat sink plate faces towards and abuts a surface of the housing. For other embodiments of the invention disclosed herein the heat transfer systems comprise one or more additional heat sink plates having thermal conductors arranged as described for the first heat sink plate.

The invention relates to an enclosure for outside plant electronic equipment which includes a housing having a main body and a cover, an electronic circuit board, having electrical component mounted thereon and at least one heat sink plate mounted to at least one of the main body or cover with a heat sink plate having at least one thermal conductor for transferring heat from at least one electrical component to said housing. The heat sink plate can be mounted to the housing a thermally conductive grease or a thermally conductive resilient material between the heat sink plate and the main body or cover.

The invention is also directed to a method for configuring outside plant telecommunication equipment by providing a main housing containing at least one electronic circuit board and providing a heat sink plate mounted to said housing. The heat sink plate has thermal conductors for contacting one or more electrical components on said electronic circuit board.

The invention is also directed to a method for providing outside plant telecommunication equipment by storing a plurality of main housings, storing a plurality of types of heat sink plates, each plate designed with thermal conductors needed to conduct heat away from electrical components of a specific type of electronic circuit board, storing a plurality of types of electronic circuit boards; and assembling outside plant telecommunication equipment by mounting at least one type of electronic circuit board to a corresponding heat sink plate and then mounting the heat sink plate to a housing.

DETAILED DESCRIPTION OF THE INVENTION

Figure 1:
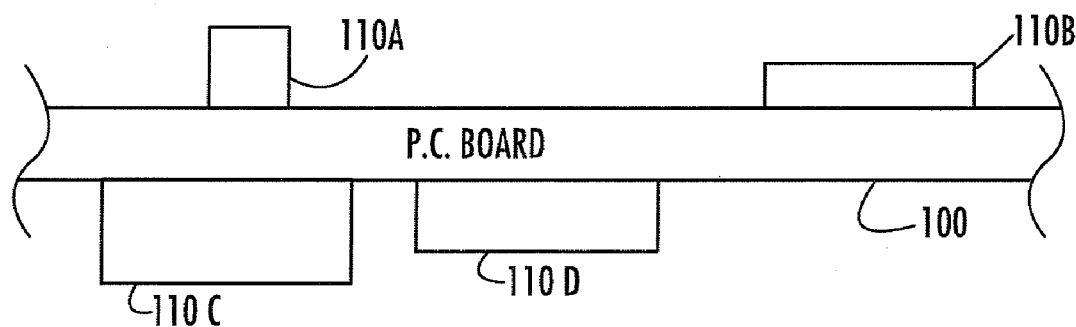
FIG. 1 is a simplified side view of an exemplary double-sided printed circuit (PC) board as known in the prior art.

FIG. 1 is a simplified side view of an exemplary double-sided printed circuit board as known in the prior art. The printed circuit board consists of a substrate 100 which includes electrically conducting paths connecting electronic components mounted on the surface of the printed circuit board. Such components are shown in FIG. 1 as items 110A, 110B, 110C and 110D. The number and arrangement of electronic components on the printed circuit board vary from design to design. Some printed circuit boards are single-sided. That is, their electronic components mount principally on one side of the board. Some printed circuit boards also contain multiple layers of conducting paths embedded at different depths within the printed circuit board substrate.

Some of the electronic components mounted on printed circuit boards dissipate a substantial amount of heat. The problem of dissipating heat from the electronic components is particularly noticeable when the electronic components are contained within an enclosure, such as used for outside plant telecommunications equipment. Such enclosures tend to be sealed to protect the electronics from environmental threats such as moisture.

Figure 2:
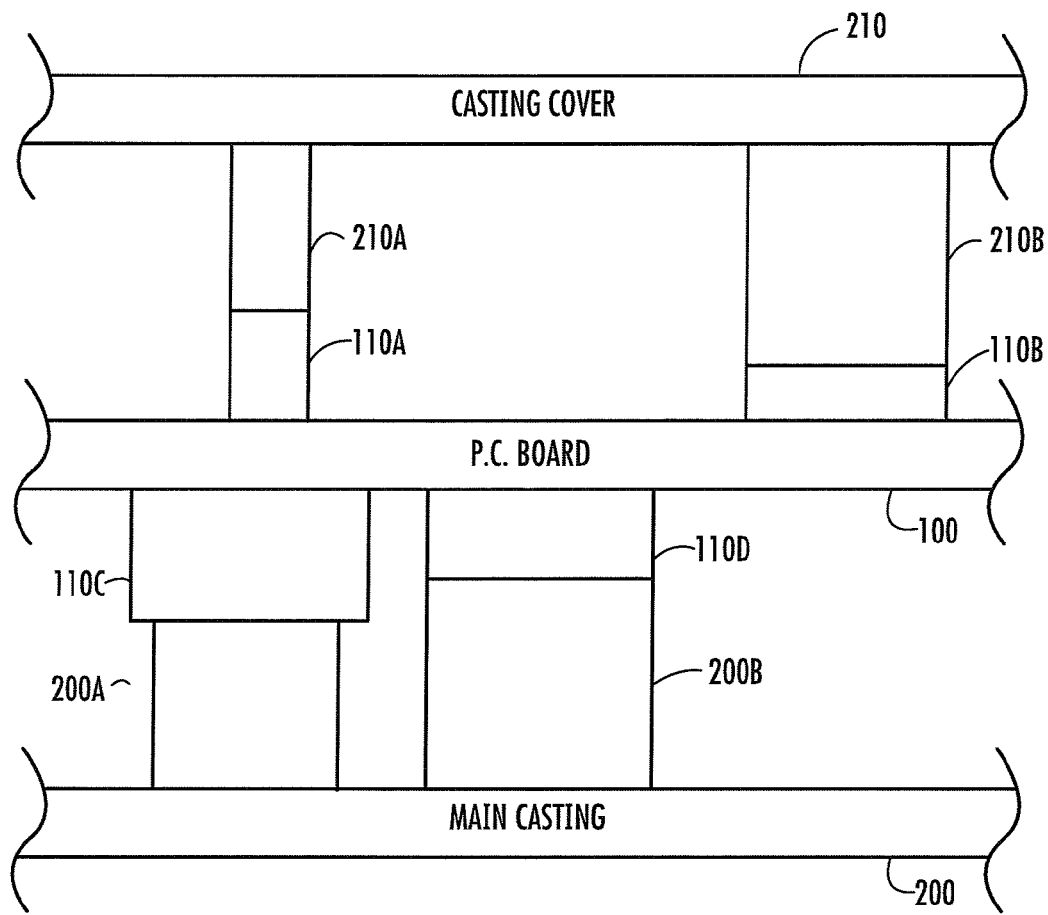
FIG. 2 is a side view showing how the exemplary PC board of FIG. 1 has been mounted to dissipate heat in the past.

FIG. 2 is a side view showing how the exemplary PC board of FIG. 1 has been mounted to dissipate heat in the past. In a typical outside plant telecommunication enclosure, there would be a main casting 200 which is enclosed by a casting cover 210. A PC board 100 is mounted within the housing, such as by connecting it to the main casting. The main casting is provided with a plurality of thermal conductors or mesas 200A and 200B that are formed as part of the casting process. The height of these thermal conductors is such as to contact the electronic devices on the printed circuit board and to conduct heat from those devices away from the device to the body of the main casting.

Similarly, the casting cover 210 is cast with similar thermal conductors 210A and 210B which are designed to contact electronic components 110A and 110B and to dissipate heat from those components by conducting it to the casting cover. A plurality of heat fins may be formed on the outer surface of both the casting cover and the main casting, to facilitate the transfer of heat away from the inside of the housing formed by the main casting and a casting cover to the external surfaces where the heat will be dissipated to the environment. Exemplary heat fins are illustrated in later drawings.

One of the difficulties with such an arrangement is the close tolerances needed for the thermal conductors to contact the electronic components so that the heat from those components can be dissipated. Either the casting tolerances need to be controlled rather rigorously or, alternatively, after casting, the surfaces of the thermal conductors may need to be subject to machining operations to ensure that the height is proper for connections to the printed circuit board's electronic components.

Another problem with the arrangement shown in FIG. 2 of the prior art is that each time the PC board is changed, such as by relocating the various electronic components to different locations, a new design for the casting is required. Both the casting and the casting covers need to be redesigned to ensure that the thermal conductors match the locations of the electronic components on the modified PC board. As a result, each main casting and casting cover forming the outside plant telecommunications housing needs to be redesigned and recast. Such a process is expensive and requires a significant lead-time to fabricate the new main casting and casting cover. Such lead-times can run in the range of 10-15 weeks.

Figure 3:
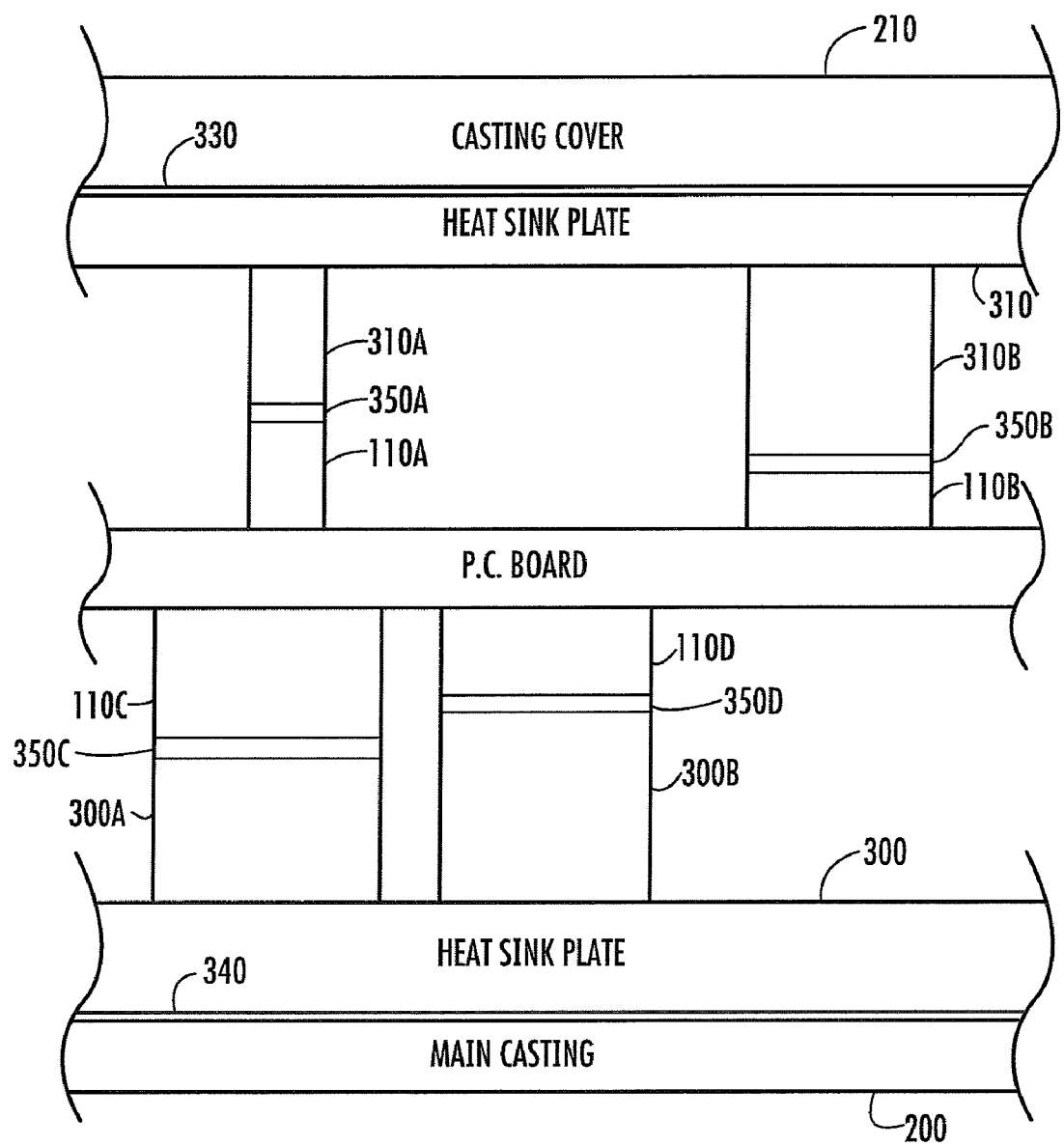
FIG. 3 is a side view showing how an exemplary PC board is mounted to dissipate heat in accordance with one aspect of the invention.

FIG. 3 is a side view showing how an exemplary PC board is mounted to dissipate heat in accordance with one aspect of the invention. As shown in FIG. 3, thermal conductors 300A and 300B are formed as part of a heat sink plate 300. The heat sink plate is then attached to the main casting. It may be desirable to place a thermally conductive grease between the heat sink plate and the main casting or a resilient thermally conductive material (340), such as that described more hereinafter.

Similarly, a heat sink plate 310 is mounted to the casting cover 210, optionally with a thermally conductive grease or a resilient thermally conductive layer 330. The heat sink plate 310 has thermal conductors 310A and 310B which function as previously discussed.

It is possible to omit a thermally conductive material 330 and 340 from between the main casting and heat sink plate or the casting cover and the heat sink plate provided that the main casting and casting cover, and the heat sink plates which interface with them, meet a certain degree of flatness and smoothness in conjunction with sufficient clamping force between the main casting/casting cover and the respective heat sink plate.

Similarly, the necessity for extreme precision in defining the heights of the thermally conductive areas, such as 310A, 310B, 300A and 300B shown in FIG. 3, can be relaxed by the use of a resilient thermally conductive material 350A, 350B, 350C and 350D, as shown in FIG. 3. By utilizing a resilient thermally conductive material such as a material manufactured by the Laird Company and identified as T-flex. These materials come in various grades indicative of their thermal conductivity. A grade 600 is highly conductive, whereas a grade 200 is not so highly conductive but is less expensive. Accordingly, the specific grade of material selected is a matter of cost benefit analysis depending on the application and on the amount of thermal flow needed at a particular location.

Figure 4:
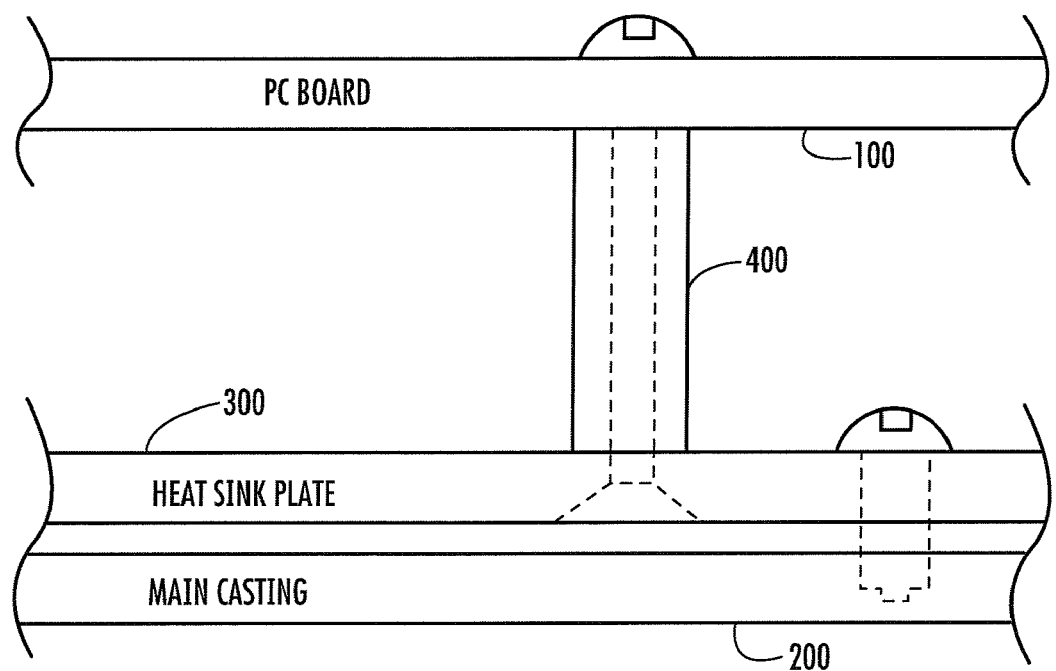
FIG. 4 is a side view showing an exemplary use of standoffs for mounting a PC board to a heat sink plate and mounting a heat sink plate to a casting.

FIG. 4 is a side view showing an exemplary use of standoffs for mounting a printed circuit board to a heat sink plate and for mounting a heat sink plate to a casting. In the example shown in FIG. 4, a PC board 100 is separated from the heat sink plate by a plurality of standoffs, such as standoff 400. In the example shown, the standoff 400 is a hexagonal spacer with threaded holes at either end. The PC board is mounted to the standoff by securing the PC board to the standoff using a screw or other appropriate fastener. Mechanical lock washers or chemical adhesive fluids can be utilized to secure the screw to the PCB/standoff to ensure it does not come loose easily. The other side of the standoff 400 is connected to the heat sink plate using a screw into the other end. Preferably, the hole for the screw through the heat sink plate is countersunk to provide a flat surface. Alternatively, the function of the standoff can be integrated into the heat sink plate casting.

Similarly, the heat sink plate 300 is mounted to the main casting 200 with or without the intervention of thermally conductive materials between the two, using a screw or similar fastener through the heat sink plate and into a treaded mounting hole in the main casting. The heat sink plate can be mounted alternatively to a casting cover.

As noted above, the height of the electronic components that rise from the surfaces of the PC board vary from component to component. Thus, the standoffs should be high enough to allow for the tallest components to clear the heat sink plate when the board is mounted in position.

Figure 5:
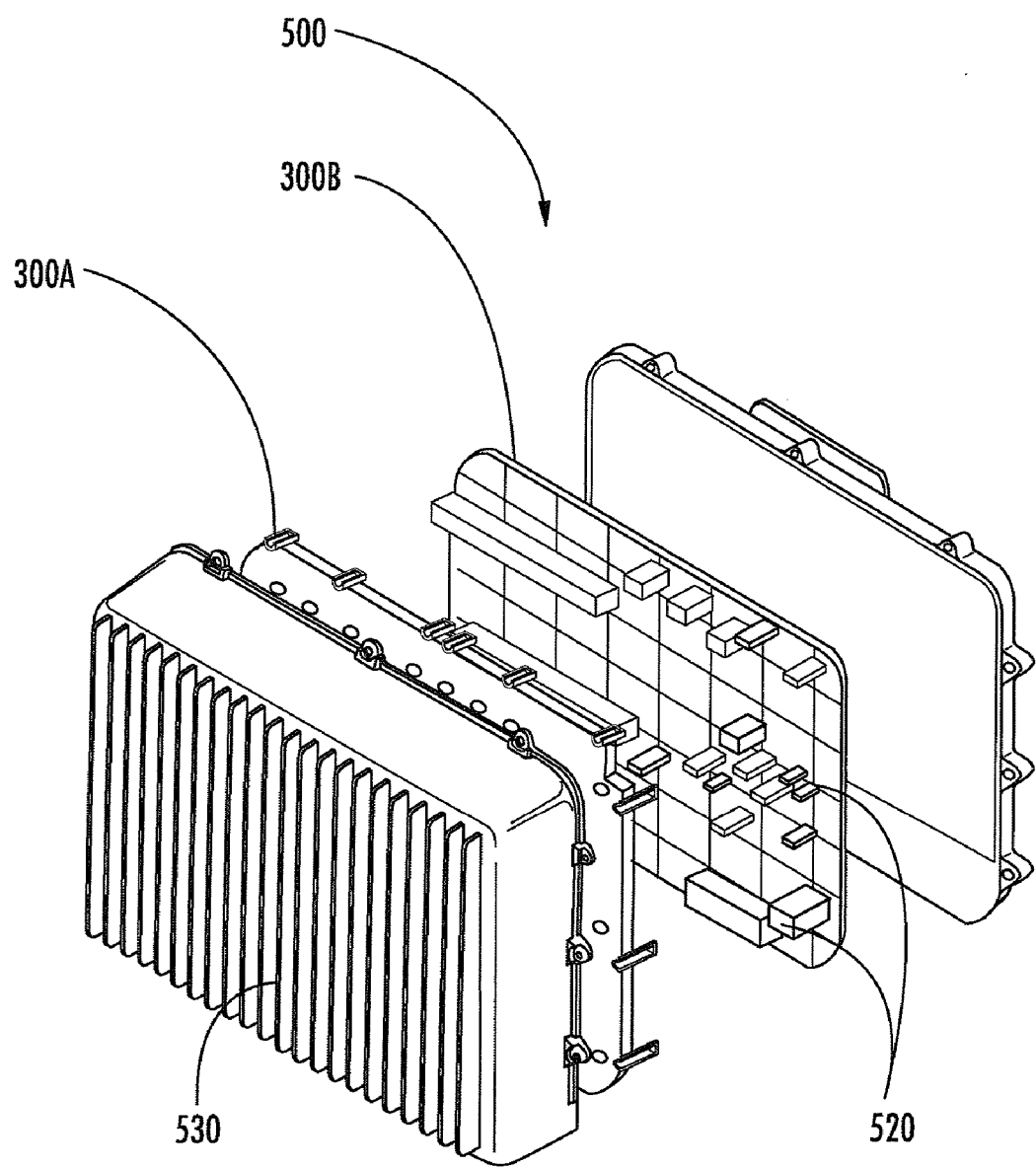
FIG. 5 is an exploded perspective view showing a main casting, first and second heat sink plates and a casting cover (PC board not shown) from a first perspective in accordance with one aspect of the invention.

FIG. 5 is an exploded perspective view showing a main casting, first and second heat sink plates and a casting cover from a first perspective in accordance with one aspect of the invention. The PC board is not shown in this Figure but would be located between the two heat sink plates 300A and 300B.

A plurality of thermal conductors such as 520 are shown on heat sink plate 300B. As noted above, the location of the thermal conductors is required to change with different configurations of PC board mounted between the heat sink plates. The thermal fins formed as part of the main casting are also shown at 530 on the outside of the main casting.

Figure 6:
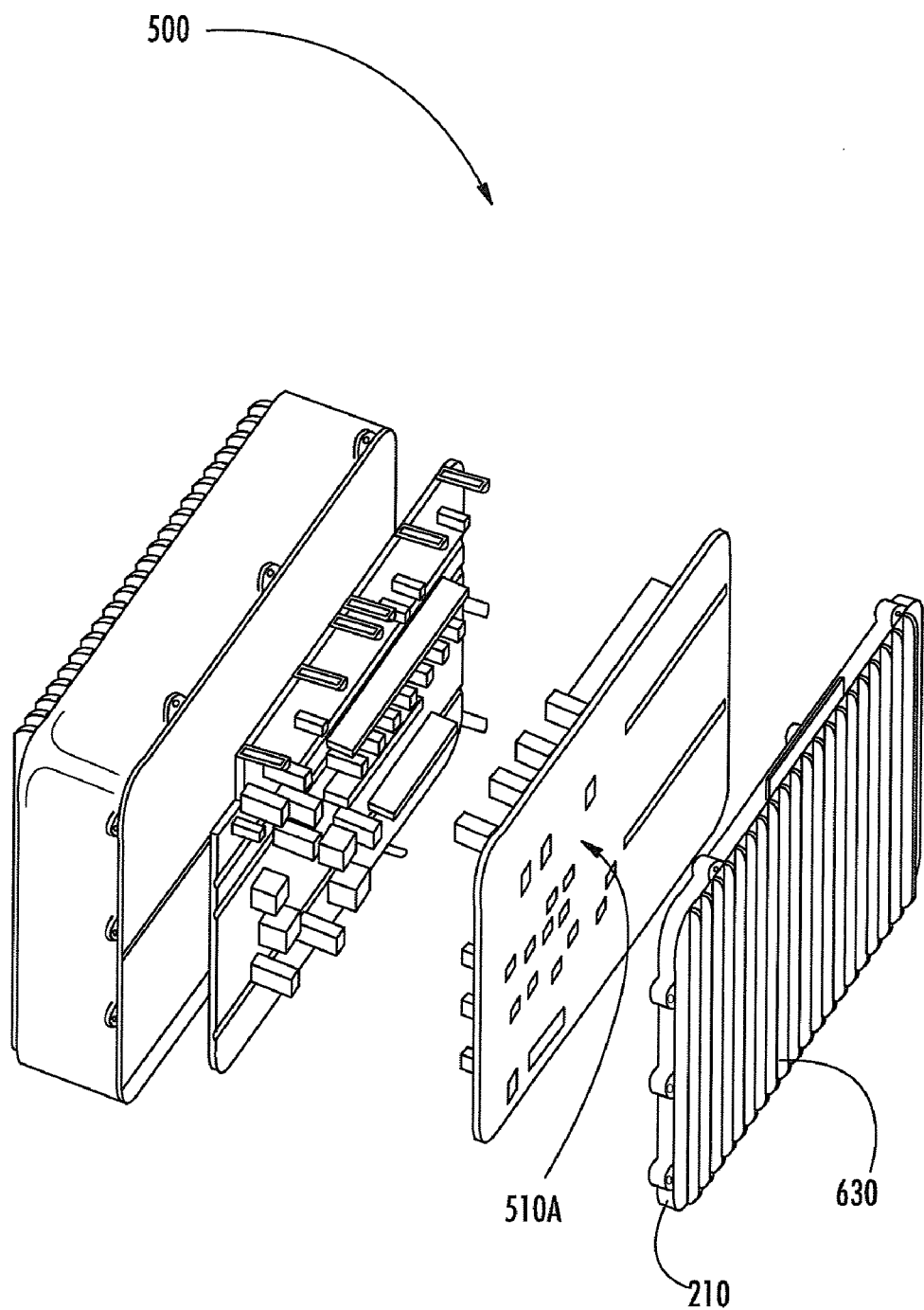
FIG. 6 is an exploded perspective view showing a main casting, first and second heat sink plates and a casting cover (PC board not shown) from a different perspective in accordance with one aspect of the invention.

FIG. 6 is an exploded perspective view of showing a main casting, first and second heat sink plates, and a casting cover from a different perspective in accordance with one aspect of the invention. In this particular example, the outside of the casting cover 210 is formed with heat dissipating fins 630. In this view, the flat side of the heat sink plate (510A) on one side is visible. That flat surface can match against the flat surface of the side of the casting cover 210 which is adjacent to the surface of the heat sink plate. In this view, a plurality of thermal conductors which extend from the surface of the heat sink plate(s) are visible.

The techniques described above offer a number of benefits to housings for enclosing electronic components.

Some of the benefits of the disclosed heat transfer apparatus include:

Components of the heat transfer apparatus, such as the heat sink plate, are reusable. In addition some of the thermal conductors may be reusable.

Since the heat transfer plates of the disclosure are relatively small, they are easier to manufacture and may be built to higher tolerances (since there are many manufacturing methods that may be used). Prior art thermal conductors were part of the main casting and therefore required larger tooling presses (higher cost, less common) and tolerances were limited.

The casting process of prior art housings limited the types of materials that could be used for thermal conductors because of cost. In addition, the casting process did not provide for tolerances that are often needed for an efficient heat transfer system. The tolerance on the thermal conductors provided by the casting process needed to be considerably wider to account for casting creep, warp, and mold shrinkage. In addition thermal conductors provided by casting were more porous and thus not as good a thermal performer.

There are more options for placement of thermal conductors with the new heat transfer apparatus.

The sizes of the thermal conductors are easy to change because of the variety of manufacturing techniques that are available.

Design changes are easier to make for the new heat transfer apparatus than for the prior art heat transfer devices.

While various embodiments of the present invention have been illustrated herein in detail, it should be apparent that modifications and adaptations to those embodiments may occur to those skilled in the art without departing from the scope of the present invention as set forth in the following claims.

What is claimed:

1. An enclosure for outside plant electronic equipment, comprising:
    a. a cast housing having a main body and a cover;
    b. an electronic circuit board, having opposing sides and electrical components on both sides;
    c. a first substantially planar configured heat sink plate mounted to said main body, said first heat sink plate having thermal conductors formed on a surface of the heat sink plate and configured to engage the electrical components on the electronic circuit board and transfer heat by conduction through the thermal conductors from the electrical components to said main body, and further comprising a resilient, thermally conductive material positioned between the thermal conductors and the electrical components and dimensioned for a frictional fit therebetween and, selected depending on the application and the amount of thermal flow needed, and further comprising one of a resilient, thermally conductive grease or thermally conductive resilient material between the heat sink plate and the main body; and
    a second substantially planar configured heat sink plate mounted to the cover such that the electronic circuit board is mounted between the first and second heat sink plates and said second heat sink plate comprising thermal conductors formed on a surface of the second heat sink plate and configured to engage the electrical components on the electronic circuit board and transfer heat by conduction through the thermal conductors from the electrical components to the cover, and further comprising a resilient, thermally conductive material positioned between the thermal conductors and the electrical components and dimensioned for a frictional fit therebetween and selected depending on the application and the amount of thermal flow needed, and further comprising one of a resilient, thermally conductive grease or thermally conductive resilient material between the second heat sink plate and the cover.

2. The enclosure of claim 1 in which the electronic circuit board is mounted to the heat sink plate using standoffs.

3. The enclosure of claim 1 in which at least one of said main body and cover has heat dissipating fins for transferring heat from the enclosure to the environment.

* * * * *